(12) United States Patent
Xue et al.

(10) Patent No.: US 11,257,410 B2
(45) Date of Patent: Feb. 22, 2022

(54) GOA CIRCUIT AND DISPLAY DEVICE

(71) Applicant: Shenzhen China Star Optoelectronics Semiconductor Display Technology Co., Ltd., Guangdong (CN)

(72) Inventors: Yan Xue, Guangdong (CN); Xian Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 189 days.

(21) Appl. No.: 16/753,174

(22) PCT Filed: Mar. 20, 2020

(86) PCT No.: PCT/CN2020/080407
§ 371 (c)(1),
(2) Date: Apr. 2, 2020

(87) PCT Pub. No.: WO2021/142922
PCT Pub. Date: Jul. 22, 2021

(65) Prior Publication Data
US 2021/0407356 A1    Dec. 30, 2021

(30) Foreign Application Priority Data
Jan. 19, 2020  (CN) .................. CN202010061117

(51) Int. Cl.
*G09G 3/20*      (2006.01)
*H01L 27/12*    (2006.01)

(52) U.S. Cl.
CPC ....... *G09G 3/20* (2013.01); *G09G 2300/0408* (2013.01); *G09G 2300/0819* (2013.01); *G09G 2310/0267* (2013.01); *G09G 2310/08* (2013.01); *H01L 27/1225* (2013.01)

(58) Field of Classification Search
None
See application file for complete search history.

(56) References Cited

U.S. PATENT DOCUMENTS

| | | | | |
|---|---|---|---|---|
| 2007/0296681 | A1* | 12/2007 | Kim | G11C 19/184 345/100 |
| 2008/0048712 | A1* | 2/2008 | Ahn | G09G 3/3677 326/21 |
| 2010/0097368 | A1* | 4/2010 | Hwang | G09G 3/3677 345/213 |
| 2017/0039950 | A1* | 2/2017 | Li | G09G 3/3266 |

(Continued)

FOREIGN PATENT DOCUMENTS

| | | |
|---|---|---|
| CN | 108538257 A | 9/2018 |
| CN | 108711399 A | 10/2018 |

(Continued)

*Primary Examiner* — Dorothy Harris

(57) ABSTRACT

The present disclosure provides a GOA circuit and a display device. The GOA circuit includes a plurality of cascaded GOA circuit units. An n-th stage GOA unit configured to output an n-th stage horizontal scanning signal includes a pull-up control unit, a feedback unit, a first pull-up unit, a second pull-up unit, a third pull-up unit, a pull-down unit, a pull-down control unit, and a bootstrap capacitor.

9 Claims, 3 Drawing Sheets

(56) References Cited

U.S. PATENT DOCUMENTS

2019/0066596 A1* 2/2019 Xue .................... G11C 19/184
2020/0048075 A1 2/2020 Chan et al.
2020/0357341 A1* 11/2020 Xue .................... G09G 3/3266

FOREIGN PATENT DOCUMENTS

| CN | 109961737 A | 7/2019 |
| CN | 110148383 A | 8/2019 |
| KR | 20190009216 A | 1/2019 |

* cited by examiner

GOA CIRCUIT AND DISPLAY DEVICE

FIELD OF INVENTION

The present disclosure relates to the field of display technologies, and more particularly, to a GOA circuit and a display device.

BACKGROUND OF INVENTION

Horizontal scanning lines of current display panels are driven by an external integrated circuit (IC). The external integrated circuit can control row scanning lines of each stage to be turned on stage by stage using a gate driver on array (GOA) technology (or called integrated gate electrode driving circuit technology). That is, the array substrate row driving technology integrates a gate electrode driving circuit into an array substrate of a display panel, thereby omitting gate electrode driver ICs and reducing product cost from two aspects of material cost and manufacturing process.

At present, panels using internal compensation methods require three or more GOA circuits, which will undoubtedly increase widths of frames.

Technical problem: an objective of the present disclosure is to provide a GOA circuit and a display device, which can drive three row scanning lines and use a set of clock signals, and numbers of required thin film transistors (TFTs) and required signal lines are less, thereby achieving narrow frames of GOA circuits.

SUMMARY OF INVENTION

To achieve the above objective, an embodiment of the present disclosure provides a GOA circuit. The GOA circuit includes a plurality of cascaded GOA circuit units. N is a natural number. An n-th stage GOA unit configured to output an n-th stage horizontal scanning signal includes a pull-up control unit, a feedback unit, a first pull-up unit, a second pull-up unit, a third pull-up unit, a pull-down unit, a pull-down control unit, and a bootstrap capacitor. The pull-up control unit is configured to receive a stage transmission signal of a previous stage and electrically connected to a first node and a second node to output the stage transmission signal of the previous stage to the first node and the second node under control of the stage transmission signal of the previous stage; the feedback unit is configured to receive a stage transmission signal of a current stage and electrically connected to the first node and the second node to feedback a voltage potential of the stage transmission signal of the current stage to the second node under control of a voltage potential of the first node; the first pull-up unit is configured to receive a first clock signal CKC and electrically connected to the first node to output a first scanning signal under the control of the voltage potential of the first node; the second pull-up unit is configured to receive a second clock CKA signal and electrically connected to the first node to output a second scanning signal under the control of the voltage potential of the first node; the third pull-up unit is configured to receive a third clock signal CKB and electrically connected to the first node to output a third scanning signal under the control of the voltage potential of the first node; the pull-down unit is configured to receive a stage transmission signal of a stage after a next stage and a low DC voltage, and electrically connected to the first node and the second node to output a low DC voltage signal to the first node and the second node under control of the stage transmission signal of the stage after the next stage; the pull-down control unit is configured to receive a high DC voltage signal and the low DC voltage signal, and electrically connected to the first node, the second node, the stage transmission signal of the current stage, the first scanning signal, the second scanning signal, and the third scanning signal to pull down voltage potentials of the first node, the second scanning signal, and the third scanning signal to a voltage potential of the low DC voltage signal, and raise a voltage potential of the first scanning signal to a voltage potential of the high DC voltage signal; and the bootstrap capacitor has two ends which are respectively connected to the first node and the first scanning signal.

In an embodiment of the present disclosure, the pull-up control unit includes a first thin film transistor, a second thin film transistor, and a third thin film transistor. A gate electrode and a drain electrode of the first thin film transistor are respectively connected to a stage transmission signal output end of the previous stage or a start pulse trigger signal, and a source electrode of the first thin film transistor is connected to the second node; and a gate electrode of the second thin film transistor is connected to the stage transmission signal output end of the previous stage or the start pulse trigger signal, and a source electrode and a drain electrode of the second thin film transistor are respectively connected to the first node and the second node.

In an embodiment of the present disclosure, wherein when n=1, the source electrode and the drain electrode of the first thin film transistor are respectively connected to the second node and the start pulse trigger signal.

In an embodiment of the present disclosure, the first pull-up unit includes a fourth thin film transistor, the second pull-up unit includes a fifth thin film transistor, and the third pull-up unit includes a sixth thin film transistor. A gate electrode of the fourth thin film transistor is connected to the first node and a source electrode and a drain electrode of the fourth thin film transistor are respectively connected to the first clock signal and a first scanning signal output end. A gate electrode of the fifth thin film transistor is connected to the first node and a source electrode and a drain electrode of the fifth thin film transistor are respectively connected to the second clock signal and a second scanning signal output end. A gate electrode of the sixth thin film transistor is connected to the first node and a source electrode and a drain electrode of the sixth thin film transistor are respectively connected to the third clock signal and a third scanning signal output end.

In an embodiment of the present disclosure, the pull-down unit includes a seventh thin film transistor and an eighth thin film transistor. A gate electrode of the seventh thin film transistor is connected to a stage transmission signal output end of the stage after the next stage, and a source electrode and a drain electrode of the seventh thin film transistor are respectively connected to the second node and the first node. A gate electrode of the eighth thin film transistor is connected to the stage transmission signal output end of the stage after the next stage, and a source electrode and a drain electrode of the eighth thin film transistor are respectively connected to the low DC voltage and the second node.

In an embodiment of the present disclosure, the pull-down control unit includes a ninth thin film transistor, a tenth thin film transistor, an eleventh thin film transistor, a twelfth thin film transistor, a thirteenth thin film transistor, a fourteenth thin film transistor, a fifth teen thin film transistor, a sixteenth thin film transistor, and a seventeenth thin film transistor. A gate electrode of the ninth thin film transistor is connected to a third node, and a source electrode and a drain electrode of the ninth thin film transistor are respectively connected to the second node and the first node. A gate electrode of the tenth thin film transistor is connected to the third node, and a source electrode and a drain electrode of the tenth thin film transistor are respectively connected to the low DC voltage and the second node. A gate electrode of the eleventh thin film transistor is connected to a high DC voltage, and a source electrode and a drain electrode of the eleventh thin film transistor are respectively connected to a gate electrode of a twelfth thin film transistor and the high DC voltage. The gate electrode of the twelfth thin film transistor is connected to the source electrode of the eleventh thin film transistor, and a source electrode and a drain electrode of the twelfth thin film transistor are respectively connected to the third node and the high DC voltage. A gate electrode of the thirteenth thin film transistor is connected to the first node, and a source electrode and a drain electrode of the thirteenth thin film transistor are respectively connected to the low DC voltage and the gate electrode of the twelfth thin film transistor. A gate electrode of the fourteenth thin film transistor is connected to the first node, and a source electrode and a drain electrode of the fourteenth thin film transistor are respectively connected to the low DC voltage and the third node. A gate electrode of the fifteenth thin film transistor is connected to the third node, and a source electrode and a drain electrode of the fifteenth thin film transistor are respectively connected to the first scanning signal output end and the high DC voltage. A gate electrode of the sixteenth thin film transistor is connected to the third node, and a source electrode and a drain electrode of the sixteenth thin film transistor are respectively connected to the second scanning signal output end and the low DC voltage. A gate electrode of the seventeenth thin film transistor is connected to the third node, and a source electrode and a drain electrode of the seventeenth thin film transistor are respectively connected to the third scanning signal output end and the low DC voltage.

In an embodiment of the present disclosure, the GOA circuit is an indium gallium zinc oxide (IGZO) GOA circuit.

The present disclosure further provides a display device which comprises the above GOA circuit.

Beneficial effect: the technical effect of the present disclosure is to provide a GOA circuit and a display device, wherein, the GOA circuit includes a plurality of cascaded GOA circuit units. An n-th stage GOA unit configured to output an n-th stage horizontal scanning signal includes a pull-up control unit, a feedback unit, a first pull-up unit, a second pull-up unit, a third pull-up unit, a pull-down unit, a pull-down control unit, and a bootstrap capacitor. The pull-up units are connected to an n-th stage horizontal scanning signal output end and a set of clock signals. The n-th stage GOA unit can drive three row scanning lines and uses a set of clock signals, wherein numbers of required thin film transistors and required signal lines are less, which not only can output a required timing for 6T2C, but also is beneficial to achieve narrow frames of GOA circuits.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

Figure 1:
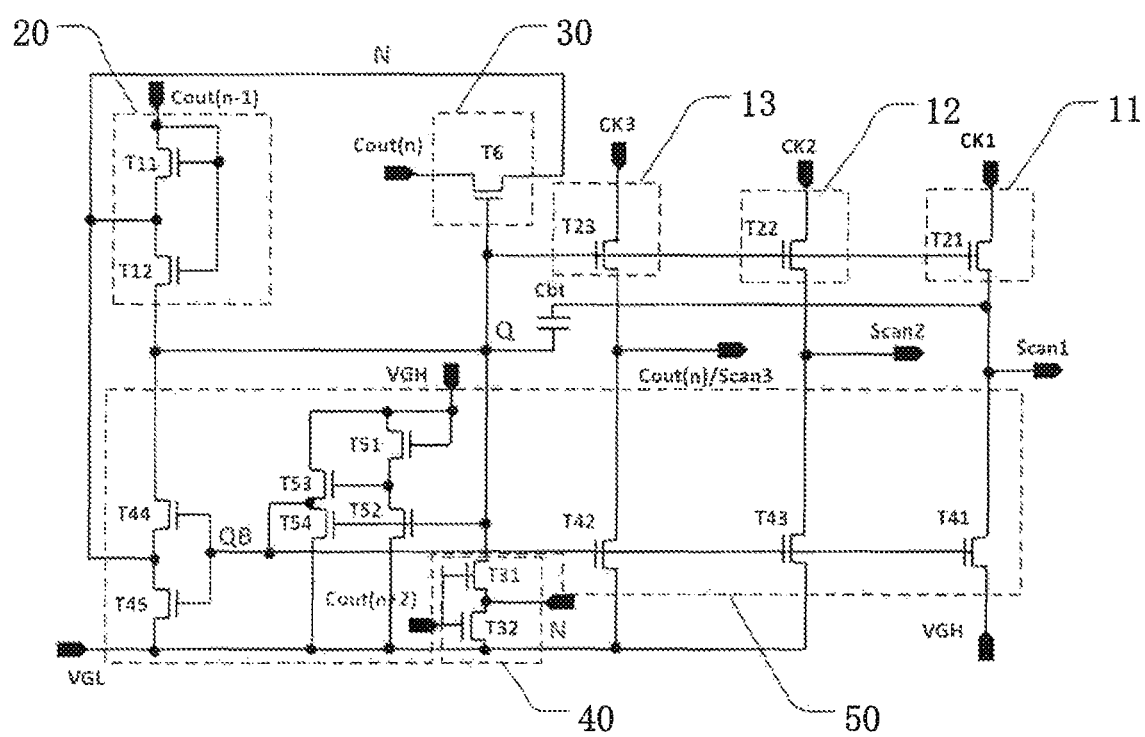
FIG. 1 is a schematic structural diagram of a GOA circuit according to an embodiment of the present disclosure.
Figure 2:
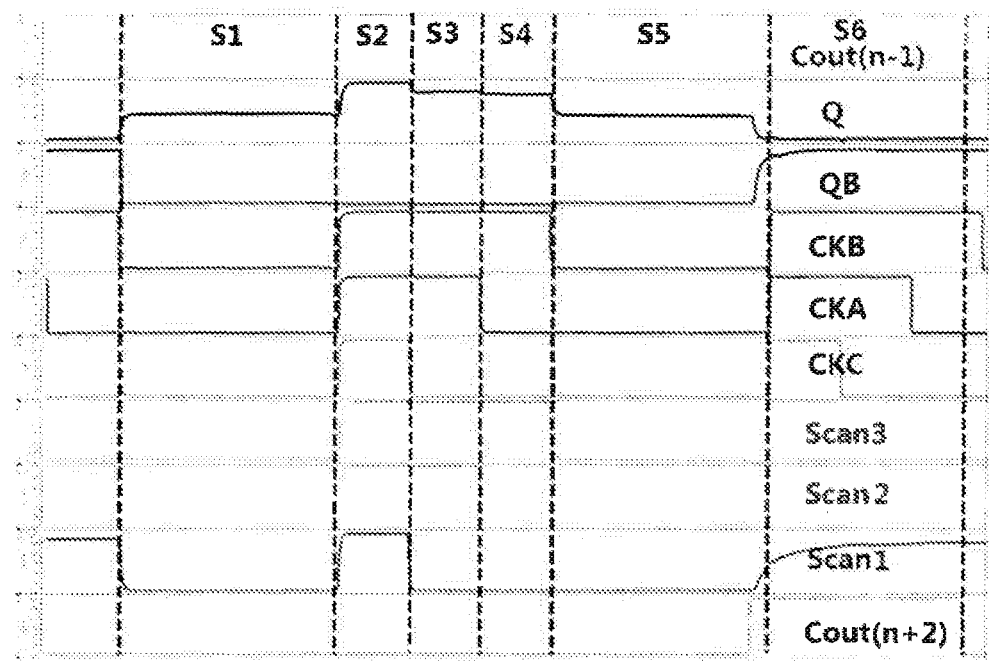
FIG. 2 is a schematic diagram of an input source signal waveform of a GOA circuit according to an embodiment of the present disclosure.

Referring to FIGS. 1 and 2, a GOA circuit in an embodiment of the present disclosure comprises seventeenth thin film transistors (TFTs) and a capacitance Cbt. A connection relationship in the circuit is shown in FIG. 1. VGH and VGL are direct current (DC) power supplies, and STV is a start pulse trigger signal for turning on a first stage GOA unit. Specific waveform and voltage potential relationships of each signal in the GOA circuit can be shown in Table 1 below. Nodes N, Q, QB, Cout(n−1), Cout(n), Cout(n+2), Scan1, Scan2, and Scan3 are imendant nodes in the circuit. CK1, CK2, and CK3 are a set of alternating current (AC) signals, Cout(n−1) is connected to a Cout(n) output signal of a previous stage, and Cout(n+2) is connected to the Cout(n) output signal of a next stage. The Cout(n−1) of a first thin film transistor T110 of a first stage in the GOA circuit is connected to an STV signal.

TABLE 1

| GOA signal | Voltage configuration | |
| --- | --- | --- |
| | Smallest (V) | Largest (V) |
| Cout(n − 1) | −10 | 20 |
| Cout(n + 2) | −10 | 20 |
| CK1 | −10 | 20 |
| CK2 | −10 | 20 |
| CK3 | −10 | 20 |
| VGH | | 20 |
| VGL | | −10 |

Referring to FIGS. 1 and 2, an embodiment of the present disclosure provides a GOA circuit. The GOA circuit includes a plurality of cascaded GOA circuit units. N is a natural number. An n-th stage GOA unit configured to output an n-th stage horizontal scanning signal includes a pull-up control unit 20, a feedback unit 30, a first pull-up unit 11, a second pull-up unit 12, a third pull-up unit 13, a pull-down unit 40, a pull-down control unit 50, and a bootstrap capacitor Cbt.

Specifically, the pull-up control unit 20 is configured to receive a stage transmission signal Cout(n−1) of a previous stage and electrically connected to a first node Q and a second node N to output the stage transmission signal Cout(n−1) of the previous stage to the first node Q and the second node N under control of the stage transmission signal Cout(n−1) of the previous stage. The feedback unit 30 is configured to receive a stage transmission signal Cout(n) of a current stage and electrically connected to the first node Q and the second node N to feedback a voltage potential of the stage transmission signal Cout(n) of the current stage to the second node N under control of a voltage potential of the first node Q. The first pull-up unit 11 is configured to receive a first clock signal CK1 and electrically connected to the first node Q to output a first scanning signal Scan1 under the control of the voltage potential of the first node Q. The second pull-up unit 12 is configured to receive a second clock signal CK2 and electrically connected to the first node Q to output a second scanning signal Scan2 under the control of the voltage potential of the first node Q. The third pull-up unit 13 is configured to receive a third clock signal CK3 and electrically connected to the first node Q to output a third scanning signal Scan3 under the control of the voltage potential of the first node Q. The third scanning signal Scan3 can provide the stage transmission signal Cout(n) of the current stage. The pull-down unit 40 is configured to receive a stage transmission signal Cout(n+2) of a stage after a next stage and a low DC voltage VGL, and electrically connected to the first node Q and the second node N to output a low DC voltage signal VGL to the first node Q and the second node N under control of the stage transmission signal Cout(n+2) of the stage after the next stage. The pull-down control unit 50 is configured to receive a high DC voltage signal VGH and the low DC voltage signal VGL, and electrically connected to the first node Q, the second node N, the stage transmission signal Cout(n) of the current stage, the first scanning signal Scant the second scanning signal Scan2, and the third scanning signal Scan3 to pull down voltage potentials of the first node Q, the second scanning signal Scan2, and the third scanning signal Scan3 to a voltage potential of the low DC voltage signal VGL, and raise a voltage potential of the first scanning signal Scant to a voltage potential of the high DC voltage signal VGH. The bootstrap capacitor Cbt has two ends which are respectively connected to the first node Q and the first scanning signal Scan1.

In an embodiment of the present disclosure, the pull-up control unit 20 mainly pulls up the voltage potential of the first node Q and controls opening times of the pull-up units 10. The pull-up control unit 20 includes a first thin film transistor T11, a second thin film transistor T12, and a third thin film transistor T6. A gate electrode and a drain electrode of the first thin film transistor T11 are respectively connected to a stage transmission signal output end Cout(n−1) of the previous stage or a start pulse trigger signal STV, and a source electrode of the first thin film transistor T11 is connected to the second node N. A gate electrode of the second thin film transistor T12 is connected to the stage transmission signal output end Cout(n−1) of the previous stage or the start pulse trigger signal STV, and a source electrode and a drain electrode of the second thin film transistor T12 are respectively connected to the first node and the second node N.

In an embodiment of the present disclosure, when n=1, the source electrode and the drain electrode of the first thin film transistor T11 are respectively connected to the second node N and the start pulse trigger signal STV.

In an embodiment of the present disclosure, the feedback unit 30 includes a third thin film transistor T6. A gate electrode of the third thin film transistor T6 is connected to the first node Q, and a source electrode and a drain electrode of the third thin film transistor T6 are respectively connected to a stage transmission signal output end Cout(n) of the current stage and the second node N.

In an embodiment of the present disclosure, the pull-up units 11, 12, and 13 are mainly responsible for converting clock signals into output signals.

The first pull-up unit 11 includes a fourth thin film transistor T21. A gate electrode of the fourth thin film transistor T21 is connected to the first node Q, and a source electrode and a drain electrode of the fourth thin film transistor T21 are respectively connected to the first clock signal CK1 and a first scanning signal output end Scan1. The fourth thin film transistor T21 is responsible for converting the first clock signal CK1 into an output signal, that is, the first scanning signal output end Scan1.

The second pull-up unit 12 comprises a fifth thin film transistor T22. A gate electrode of the fifth thin film transistor T22 is connected to the first node and a source electrode and a drain electrode of the fifth thin film transistor T22 are respectively connected to the second clock signal CK2 and a second scanning signal output end Scan2. The fifth thin film transistor T22 is responsible for converting the second clock signal CK2 into an output signal, that is, the second scanning signal output end Scan2.

The third pull-up unit 13 comprises a sixth thin film transistor T23. A gate electrode of the sixth thin film transistor T23 is connected to the first node Q and a source electrode and a drain electrode of the sixth thin film transistor T23 are respectively connected to the third clock signal CK3 and a third scanning signal output end Scan3. The sixth thin film transistor T23 is responsible for converting the third clock signal CK3 into an output signal, that is, the third scanning signal output end Scan3.

In an embodiment of the present disclosure, the pull-down unit 40 is mainly responsible for pulling down the voltage potentials of the first node Q and the output signal to a low voltage potential at a first time. The pull-down unit 40 includes a seventh thin film transistor T31 and an eighth thin film transistor T32. A gate electrode of the seventh thin film transistor T31 is connected to a stage transmission signal output end Cout(n+2) of the stage after the next stage, and a source electrode and a drain electrode of the seventh thin film transistor T31 are respectively connected to the second node N and the first node Q. A gate electrode of the eighth thin film transistor T32 is connected to the stage transmission signal output end Cout(n+2) of the stage after the next stage, and a source electrode and a drain electrode of the eighth thin film transistor T32 are respectively connected to the low DC voltage VGL and the second node N.

In an embodiment of the present disclosure, the pull-down control unit 50 is mainly responsible for maintaining the voltage potential of the first node in a turned-off state. The pull-down control unit 50 includes a ninth thin film transistor T44, a tenth thin film transistor T45, an eleventh thin film transistor T51, a twelfth thin film transistor T53, a thirteenth thin film transistor T52, a fourteenth thin film transistor T54, a fifth thin film transistor T41, a sixteenth thin film transistor T43, and a seventeenth thin film transistor T42.

A gate electrode of the ninth thin film transistor T44 is connected to a third node QB, and a source electrode and a drain electrode of the ninth thin film transistor T44 are respectively connected to the second node N and the first node Q.

A gate electrode of the tenth thin film transistor T45 is connected to the third node QB, and a source electrode and a drain electrode of the tenth thin film transistor T45 are respectively connected to the low DC voltage VGL and the second node N.

A gate electrode of the eleventh thin film transistor T51 is connected to a high DC voltage VGH, and a source electrode and a drain electrode of the eleventh thin film transistor T51 are respectively connected to a gate electrode of the twelfth thin film transistor T53 and the high DC voltage VGH. The gate electrode of the twelfth thin film transistor T53 is connected to the source electrode of the eleventh thin film transistor T51, and a source electrode and a drain electrode of the twelfth thin film transistor T53 are respectively connected to the third node QB and the high DC voltage VGH.

A gate electrode of the thirteenth thin film transistor T52 is connected to the first node Q, and a source electrode and a drain electrode of the thirteenth thin film transistor T52 are respectively connected to the low DC voltage VGL and the gate electrode of the twelfth thin film transistor T53.

A gate electrode of the fourteenth thin film transistor T54 is connected to the first node Q, and a source electrode and a drain electrode of the fourteenth thin film transistor T54 are respectively connected to the low DC voltage VGL and the third node QB.

A gate electrode of the fifteenth thin film transistor T41 is connected to the third node QB, and a source electrode and a drain electrode of the fifteenth thin film transistor T41 are respectively connected to the first scanning signal output end Scan1 and the high DC voltage VGH.

A gate electrode of the sixteenth thin film transistor T43 is connected to the third node QB, and a source electrode and a drain electrode of the sixteenth thin film transistor T43 are respectively connected to the second scanning signal output end Scant and the low DC voltage VGL.

A gate electrode of the seventeenth thin film transistor T42 is connected to the third node QB, and a source electrode and a drain electrode of the seventeenth thin film transistor T42 are respectively connected to the third scanning signal output end Scan3 and the low DC voltage VGL.

The bootstrap capacitor Cbt has two ends which are respectively connected to the first node Q and the first scanning signal Scan1, and is responsible for a secondary rise of the voltage potential of the first node Q, which is beneficial for outputting of the first scanning signal Scan1.

In an embodiment of the present disclosure, the GOA circuit is manufactured based on an indium gallium zinc oxide (IGZO) material.

Figure 3:
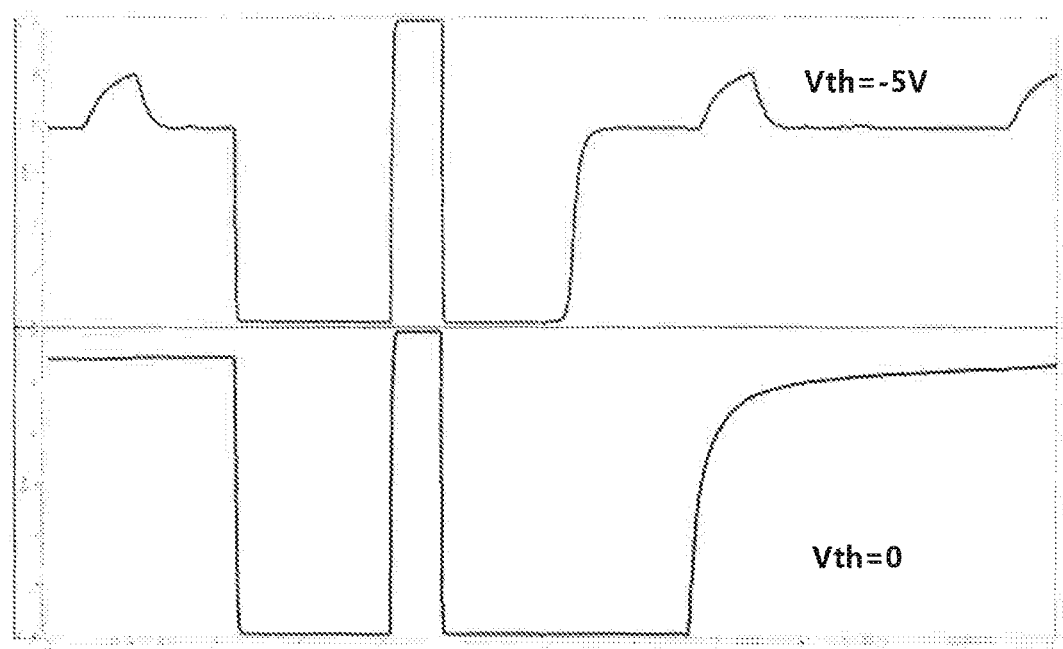
FIG. 3 is a schematic diagram of an output waveform of an n-th stage GOA unit of a GOA circuit according to an embodiment of the present disclosure.

Referring to FIG. 3, FIG. 3 is a schematic diagram of an output waveform of an n-th stage GOA unit of a GOA circuit according to an embodiment of the present disclosure. An excellent signal output can be obtained by bringing the waveform shown in FIG. 2 into the GOA circuit of the embodiment of the present disclosure. According to simulation results, stability of the GOA circuit is good, a threshold voltage Vth is negatively biased by −5V, and output of the first scanning signal Scan1 is still stable. The following takes a single stage GOA circuit as an example to illustrate a working process of the circuit.

Step S1: when Cout(n−1) is at a high voltage potential, T11 and T12 are turned on, the high voltage potential of Cout(n−1) transmits to node Q, the node Q is at the high voltage potential, and at same time, T21, T22, and T23 are turned on. Because an inverter structure consisting of T51, T52, T53, and T54 connects node Q and node QB, voltage potentials thereof are opposite. Therefore, node QB is at a low voltage potential, and T41, T42, T43, T44, and T45 are all turned off. At the same time, Cout(n+2) is at the low voltage potential, T31 and T32 are turned off, CK1, CK2, and CK3 are at the low voltage potential, and output signals Scan3, Scan2, and Scan1 output the low voltage potential.

Step S2: then, Cout(n−1) is at the low voltage potential, T11 and T12 are turned off, at this time, CK1, Ck2, and CK3 rise to the high voltage potential from the low voltage potential, node Q rises to a higher voltage potential due to a capacitive coupling effect, T31, T32, T41, T42, T43, T44, and T45 maintain turned off, and at this time, Scant Scan2, and Scan3 output the high voltage potential. At this time, T6 is turned on, node N is at the high voltage potential, and the voltage potential reduces leakage currents of T12, T44, and T32.

Step S3: CK1 is switched from the high voltage potential to the low voltage potential, the voltage potential of node Q is decreased a little bit, and at same time, Scan1 outputs the low voltage potential.

Step S4: CK2 is switched from the high voltage potential to the low voltage potential, the voltage potential of node Q is decreased, and at same time, Scant outputs the low voltage potential.

Step S5: CK3 is switched from the high voltage potential to the low voltage potential, the voltage potential of node Q is decreased, and at same time, Scan3 outputs the low voltage potential.

Step S6: Cout(n+2) rises to the high voltage potential, T31 and T32 are turned on, node Q is pulled down to the low voltage potential, and due to existence of the inverter consisting of T51, T52, T53, and T54, node QB rises to the high voltage potential, T41, T42, T43, T44, and T45 are turned on, and Scant outputs the high voltage potential.

Voltage potential maintenance capability of the first node Q in the embodiment is an important factor limiting indium gallium zinc oxide (IGZO) based GOA circuit to output wide pulse signals. The GOA circuit in the embodiments of the present disclosure can be applied to an IGZO-GOA circuit and a demultiplexer (Demux) GOA circuit, which can effectively maintain the voltage potential of node Q and output wide pulse GOA signals. The present disclosure can be applied to a liquid crystal display (LCD) and an organic light-emitting diode display. In summary, The GOA circuit in the embodiments of the present disclosure can effectively solve the problem of maintaining the voltage potential of the first node Q and output wide pulse GOA signals. The first stage GOA circuit in the embodiment of the present disclosure can drive three row scanning lines, which reduces occupied space of the GOA circuit layout, and only needs a set of CK signals, which further reduces a number of signal lines and space occupied by the layout, thereby beneficial to narrow frames of the display screen.

Figure 4:
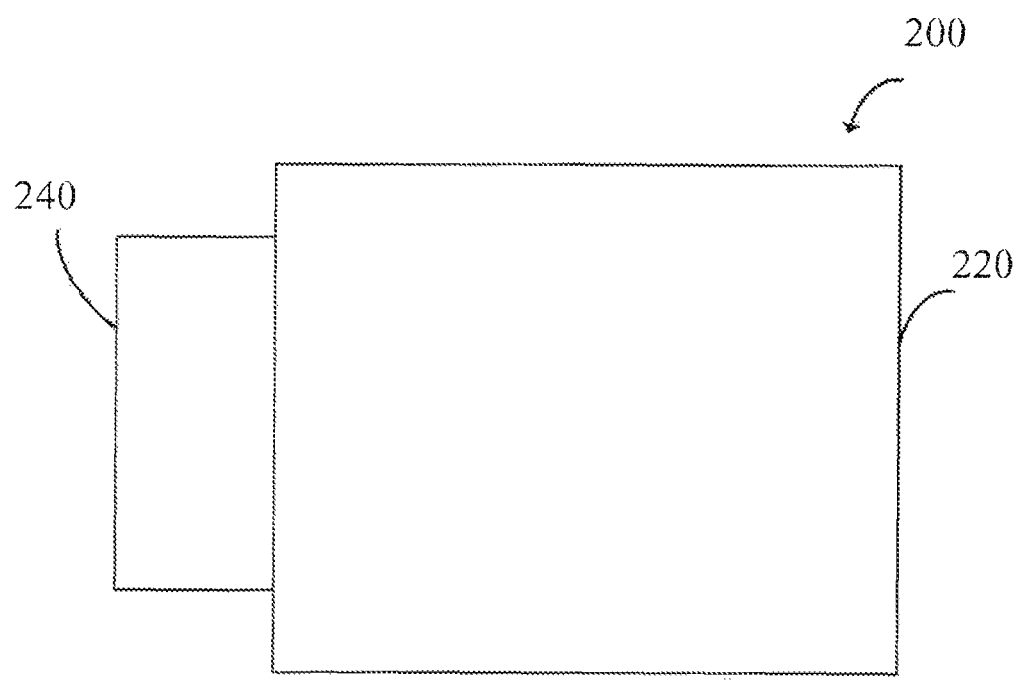
FIG. 4 is a schematic diagram of a display device according to an embodiment of the present disclosure.

Referring to FIG. 4, in an embodiment of the present disclosure, a display device 200 comprises a panel 220 and a GOA circuit 240 disposed on one side of the panel 220. The GOA circuit 240 is the GOA circuit described in any of the above embodiments. The display device 200 may be an LCD display or an OLED display.

In the GOA circuit and the display device of the embodiment of the present disclosure, the GOA circuit comprises a plurality of cascaded GOA circuit units. An n-th stage GOA unit configured to output an n-th stage horizontal scanning signal includes a pull-up control unit, a feedback unit, a first pull-up unit, a second pull-up unit, a third pull-up unit, a pull-down unit, a pull-down control unit, and a bootstrap capacitor. The pull-up units are connected to an n-th stage horizontal scanning signal output end and a set of clock signals. The n-th stage GOA unit can drive three row scanning lines and uses a set of clock signals, wherein numbers of required thin film transistors and required signal lines are less, which not only can output a required timing for 6T2C, but also is beneficial to achieve narrow frames of GOA circuits.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A gate driver on array (GOA) circuit, comprising a plurality of cascaded GOA units, wherein an n-th stage GOA unit configured to output an n-th stage horizontal scanning signal, wherein n is a natural number, comprises:
    a pull-up control unit configured to receive a stage transmission signal of a previous stage and electrically connected to a first node and a second node to output the stage transmission signal of the previous stage to the first node and the second node under control of the stage transmission signal of the previous stage;
    a feedback unit configured to receive a stage transmission signal of a current stage and electrically connected to the first node and the second node to feedback a voltage potential of the stage transmission signal of the current stage to the second node under control of a voltage potential of the first node;
    a first pull-up unit configured to receive a first clock signal and electrically connected to the first node to output a first scanning signal under the control of the voltage potential of the first node;
    a second pull-up unit configured to receive a second clock signal and electrically connected to the first node to output a second scanning signal under the control of the voltage potential of the first node;
    a third pull-up unit configured to receive a third clock signal and electrically connected to the first node to output a third scanning signal under the control of the voltage potential of the first node;
    a pull-down unit configured to receive a stage transmission signal of a stage after a next stage and a low DC voltage, and electrically connected to the first node and the second node to output a low DC voltage signal to the first node and the second node under control of the stage transmission signal of the stage after the next stage;
    a pull-down control unit configured to receive a high DC voltage signal and the low DC voltage signal, and electrically connected to the first node, the second node, the stage transmission signal of the current stage, the first scanning signal, the second scanning signal, and the third scanning signal to pull down voltage potentials of the first node, the second scanning signal, and the third scanning signal to a voltage potential of the low DC voltage signal, and raise a voltage potential of the first scanning signal to a voltage potential of the high DC voltage signal; and
    a bootstrap capacitor having two ends respectively connected to the first node and the first scanning signal.

2. The GOA circuit according to claim 1, wherein the pull-up control unit comprises:
    a first thin film transistor, wherein a gate electrode and a drain electrode of the first thin film transistor are respectively connected to a stage transmission signal output end of the previous stage or a start pulse trigger signal, and a source electrode of the first thin film transistor is connected to the second node; and
    a second thin film transistor, wherein a gate electrode of the second thin film transistor is connected to the stage transmission signal output end of the previous stage or the start pulse trigger signal, and a source electrode and a drain electrode of the second thin film transistor are respectively connected to the first node and the second node.

3. The GOA circuit according to claim 2, wherein when n=1, the source electrode and the drain electrode of the first thin film transistor are respectively connected to the second node and the start pulse trigger signal.

4. The GOA circuit according to claim 1, wherein the feedback unit comprises:
    a third thin film transistor, wherein a gate electrode of the third thin film transistor is connected to the first node, and a source electrode and a drain electrode of the third thin film transistor are respectively connected to a stage transmission signal output end of the current stage and the second node.

5. The GOA circuit according to claim 1, wherein the first pull-up unit comprises a fourth thin film transistor, wherein a gate electrode of the fourth thin film transistor is connected to the first node and a source electrode and a drain electrode of the fourth thin film transistor are respectively connected to the first clock signal and a first scanning signal output end;
    the second pull-up unit comprises a fifth thin film transistor, wherein a gate electrode of the fifth thin film transistor is connected to the first node and a source electrode and a drain electrode of the fifth thin film transistor are respectively connected to the second clock signal and a second scanning signal output end; and
    the third pull-up unit comprises a sixth thin film transistor, wherein a gate electrode of the sixth thin film transistor is connected to the first node and a source electrode and a drain electrode of the sixth thin film transistor are respectively connected to the third clock signal and a third scanning signal output end.

6. The GOA circuit according to claim 1, wherein the pull-down unit comprises:
    a seventh thin film transistor, wherein a gate electrode of the seventh thin film transistor is connected to a stage transmission signal output end of the stage after the next stage, and a source electrode and a drain electrode of the seventh thin film transistor are respectively connected to the second node and the first node; and
    an eighth thin film transistor, wherein a gate electrode of the eighth thin film transistor is connected to the stage transmission signal output end of the stage after the next stage, and a source electrode and a drain electrode of the eighth thin film transistor are respectively connected to the low DC voltage and the second node.

7. The GOA circuit according to claim 1, wherein the pull-down control unit comprises:
    a ninth thin film transistor, wherein a gate electrode of the ninth thin film transistor is connected to a third node, and a source electrode and a drain electrode of the ninth thin film transistor are respectively connected to the second node and the first node;
    a tenth thin film transistor, wherein a gate electrode of the tenth thin film transistor is connected to the third node, and a source electrode and a drain electrode of the tenth thin film transistor are respectively connected to the low DC voltage and the second node;

an eleventh thin film transistor, wherein a gate electrode of the eleventh thin film transistor is connected to a high DC voltage, and a source electrode and a drain electrode of the eleventh thin film transistor are respectively connected to a gate electrode of a twelfth thin film transistor and the high DC voltage;

the twelfth thin film transistor, wherein the gate electrode of the twelfth thin film transistor is connected to the source electrode of the eleventh thin film transistor, and a source electrode and a drain electrode of the twelfth thin film transistor are respectively connected to the third node and the high DC voltage;

a thirteenth thin film transistor, wherein a gate electrode of the thirteenth thin film transistor is connected to the first node, and a source electrode and a drain electrode of the thirteenth thin film transistor are respectively connected to the low DC voltage and the gate electrode of the twelfth thin film transistor;

a fourteenth thin film transistor, wherein a gate electrode of the fourteenth thin film transistor is connected to the first node, and a source electrode and a drain electrode of the fourteenth thin film transistor are respectively connected to the low DC voltage and the third node;

a fifteenth thin film transistor, wherein a gate electrode of the fifteenth thin film transistor is connected to the third node, and a source electrode and a drain electrode of the fifteenth thin film transistor are respectively connected to the first scanning signal output end and the high DC voltage;

a sixteenth thin film transistor, wherein a gate electrode of the sixteenth thin film transistor is connected to the third node, and a source electrode and a drain electrode of the sixteenth thin film transistor are respectively connected to the second scanning signal output end and the low DC voltage; and a seventeenth thin film transistor, wherein a gate electrode of the seventeenth thin film transistor is connected to the third node, and a source electrode and a drain electrode of the seventeenth thin film transistor are respectively connected to the third scanning signal output end and the low DC voltage.

8. The GOA circuit according to claim 1, which is an indium gallium zinc oxide (IGZO) GOA circuit.

9. A display device, comprising the GOA circuit according to claim 1.

* * * * *